(12) United States Patent
Chuma et al.

(10) Patent No.: US 8,748,751 B2
(45) Date of Patent: Jun. 10, 2014

(54) ELECTRONIC COMPONENT PACKAGE AND METHOD FOR PRODUCING ELECTRONIC COMPONENT PACKAGE

(75) Inventors: Toshiaki Chuma, Tokyo (JP); Masayoshi Kondo, Tokyo (JP); Satoshi Tanaka, Tokyo (JP); Kenichi Kanemasa, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 195 days.

(21) Appl. No.: 13/128,338

(22) PCT Filed: Nov. 19, 2009

(86) PCT No.: PCT/JP2009/006232
§ 371 (c)(1),
(2), (4) Date: May 9, 2011

(87) PCT Pub. No.: WO2010/061552
PCT Pub. Date: Jun. 3, 2010

(65) Prior Publication Data
US 2011/0226513 A1 Sep. 22, 2011

(30) Foreign Application Priority Data
Nov. 25, 2008 (JP) .................. P2008-300113

(51) Int. Cl.
*H05K 1/16* (2006.01)
(52) U.S. Cl.
USPC .......................... 174/260; 174/262; 174/267
(58) Field of Classification Search
None
See application file for complete search history.

(56) References Cited

U.S. PATENT DOCUMENTS

| 5,072,289 | A | | 12/1991 | Sugimoto et al. | |
|---|---|---|---|---|---|
| 5,897,337 | A | | 4/1999 | Kata et al. | |
| 5,904,782 | A | * | 5/1999 | Diep-Quang | 148/23 |
| 6,798,072 | B2 | * | 9/2004 | Kajiwara et al. | 257/778 |
| 7,242,097 | B2 | * | 7/2007 | Hua | 257/767 |
| 7,279,771 | B2 | * | 10/2007 | Sunohara et al. | 257/516 |
| 7,453,155 | B2 | * | 11/2008 | Hsu | 257/778 |

(Continued)

FOREIGN PATENT DOCUMENTS

| JP | 2-229445 A | 9/1990 |
|---|---|---|
| JP | 8-102474 A | 4/1996 |

(Continued)

OTHER PUBLICATIONS

International Search Report for PCT/JP2009/006232 dated Feb. 2, 2010.

*Primary Examiner* — Ishwarbhai B Patel
(74) *Attorney, Agent, or Firm* — Birch, Stewart, Kolasch & Birch, LLP (57) ABSTRACT

Disclosed is an electronic component package (100) including a circuit board (10), an electronic component (20), and an adhesive layer (30). The circuit board (10) is provided with an electrically-conductive conductor post (16) which is buried in a base member (12), and a solder layer (18) which is provided at the front end (13) of the conductor post (16) while exposed from a surface (121) of the base member (12). An electrode pad (24) having a metal layer (22) mounted thereon is provided on the main surface (26) of the electronic component (20). The adhesive layer (30) contains a flux activating compound, and bonds the surface (121) of the base member (12) and the main surface (26) of the electronic component (20). Then, the metal layer (22) and the solder layer (18) are metalbonded.

14 Claims, 8 Drawing Sheets

(56) References Cited

U.S. PATENT DOCUMENTS

| | | | | |
|---|---|---|---|---|
| 7,952,207 | B2* | 5/2011 | Jadhav et al. | 257/778 |
| 2003/0218261 | A1* | 11/2003 | Capote et al. | 257/787 |
| 2004/0105223 | A1* | 6/2004 | Okada et al. | 361/683 |
| 2008/0053572 | A1* | 3/2008 | Sanji et al. | 148/23 |
| 2008/0280392 | A1* | 11/2008 | Stapleton | 438/106 |
| 2010/0129960 | A1 | 5/2010 | Mejima et al. | |

FOREIGN PATENT DOCUMENTS

| | | | |
|---|---|---|---|
| JP | 2001-7236 A | | 1/2001 |
| JP | 2002-190544 A | | 7/2002 |
| JP | 2003218286 A | * | 7/2003 |
| JP | 2004-291054 A | | 10/2004 |
| JP | 2008-153482 A | | 7/2008 |
| WO | WO 02/076161 A1 | | 9/2002 |
| WO | WO 2008/136352 A1 | | 11/2008 |

* cited by examiner

ELECTRONIC COMPONENT PACKAGE AND METHOD FOR PRODUCING ELECTRONIC COMPONENT PACKAGE

TECHNICAL FIELD

The present invention relates to an electronic component package and a method for producing the electronic component package.

BACKGROUND ART

With the recent requirements of higher functionality and reduction in weight and size of electronic equipments, high-density integration and high-density mounting of electronic components are in progress.

With respect to this technology, the following Patent Document 1 discloses an invention of a semiconductor package in which a plating layer made of gold or nickel is provided on a surface of a conductor post protruding from an interposer substrate, and such a conductor post is bonded to an electrode pad formed on a semiconductor chip.

RELATED DOCUMENT

Patent Document

Patent Document 1: Japanese Patent Application Laid-Open No. 2008-153482

DISCLOSURE OF THE INVENTION

However, in a semiconductor package described in the above Patent Document, bonding capability between the conductor post and the electrode pad is not sufficient so that further improvement has been in demand.

The present invention has been accomplished in view of the above circumstances, and is to provide an electronic component package achieving high-density mounting of the electronic component and at the same time having an electrode pad in the electronic component and a circuit board which are integrated into one body with a high bonding strength, and a method for producing the electronic component package.

The electronic component package of the present invention includes a circuit board having a base member, an electrically-conductive conductor post which is buried in the base member, and a solder layer which is provided at the front end of the conductor post while exposed from a surface of the base member, an electronic component in which an electrode pad having a metal layer mounted thereon is provided on the main surface thereof, and an adhesive layer containing a flux activating compound, and bonding the surface of the base member and the main surface of the electronic component, wherein the metal layer and the solder layer are metal-bonded.

Furthermore, in the electronic component package of the present invention, as a more specific embodiment, the solder layer may contain tin, and the metal layer may be made of at least one kind of metals selected from gold, nickel, aluminum and copper, an alloy containing the metal, or a solder containing tin.

Furthermore, in the electronic component package of the present invention, as a more specific embodiment, the circuit board may be a flexible printed board.

The method for producing an electronic component package of the present invention includes preparing a circuit board having a base member, an electrically-conductive conductor post which is buried in the base member, and a solder layer which is provided at the front end of the conductor post while exposed from a surface of the base member, preparing an electronic component in which an electrode pad having a metal layer mounted thereon is provided on the main surface thereof, forming an adhesive layer including attaching an adhesive layer containing a flux activating compound to at least one of the surface of the circuit board and the main surface of the electronic component, thus covering the solder layer or the metal layer, aligning the position by bringing the circuit board and the electronic component into pressure contact with each other in a heated state while the conductor post and the electrode pad are opposed to each other, and bonding the circuit board and the electronic component with the adhesive layer, and at the same time aligning the positions of the solder layer and the metal layer, and metal-bonding the solder layer and the metal layer by heat-melting the solder layer.

Incidentally, the method for producing an electronic component package of the present invention, sequentially enumerating a plurality of steps, does not necessarily limit the order of execution of the plurality of steps, except those specified. Accordingly, when the method for producing an electronic component package of the present invention is carried out, the order of the plurality of steps may be varied, insofar as the variation does not adversely affect quality of the processes.

Furthermore, the plurality of steps of the method for producing an electronic component package of the present invention are not limited to be executed at different points of time. For this reason, a certain step may start when any other step is executed, or a period over which a certain step is executed may partially, or totally, overlap a period over which any other step is executed.

Effect Of The Invention

In the electronic component package of the present invention, since the back surface side of the circuit board having a conductor post can be a mounting surface, high-density mounting on the mounting surface can be achieved.

According to the present invention, an adhesive layer for bonding the circuit board and the electronic component contains a flux activating compound, so that the surfaces of the solder layer and the metal layer are reduced because of the compound, and an oxide film cannot be formed. For this reason, the solder layer and the metal layer are well metal-bonded so that the conductor post and the electrode pad can be integrated into one body with a high bonding strength.

BRIEF DESCRIPTION OF THE DRAWINGS

The above and other objects, features and advantages of the present invention will be more apparent from the following description of the preferred embodiments in conjunction with the accompanying drawings.

FIG. 5 (a) is a cross-sectional view illustrating a state in which a step of forming an adhesive layer is carried out on a circuit board, (b) is a cross-sectional view illustrating a step of aligning the position, (c) is a cross-sectional view illustrating a bonding step, and (d) is a cross-sectional view illustrating a step of mounting a bump.

DESCRIPTION OF EMBODIMENTS

The present invention will be described in more detail in conjunction with the drawings below. Incidentally, in all drawings, the same components are assigned the same reference numerals and appropriate explanations thereof will be omitted.

First Embodiment

Electronic Component Package

Figure 1:
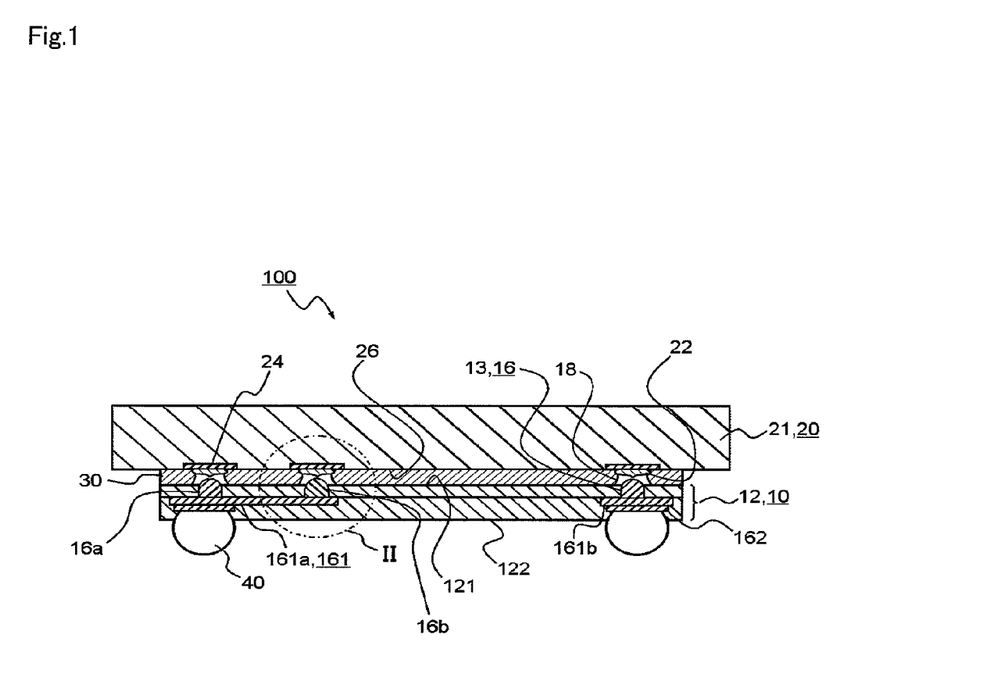
FIG. 1 is a laminated cross-sectional view illustrating one example of an electronic component package of a first embodiment of the present invention.

FIG. 1 is a laminated cross-sectional view illustrating one example of an electronic component package 100 of a first embodiment of the present invention.

Figure 2:
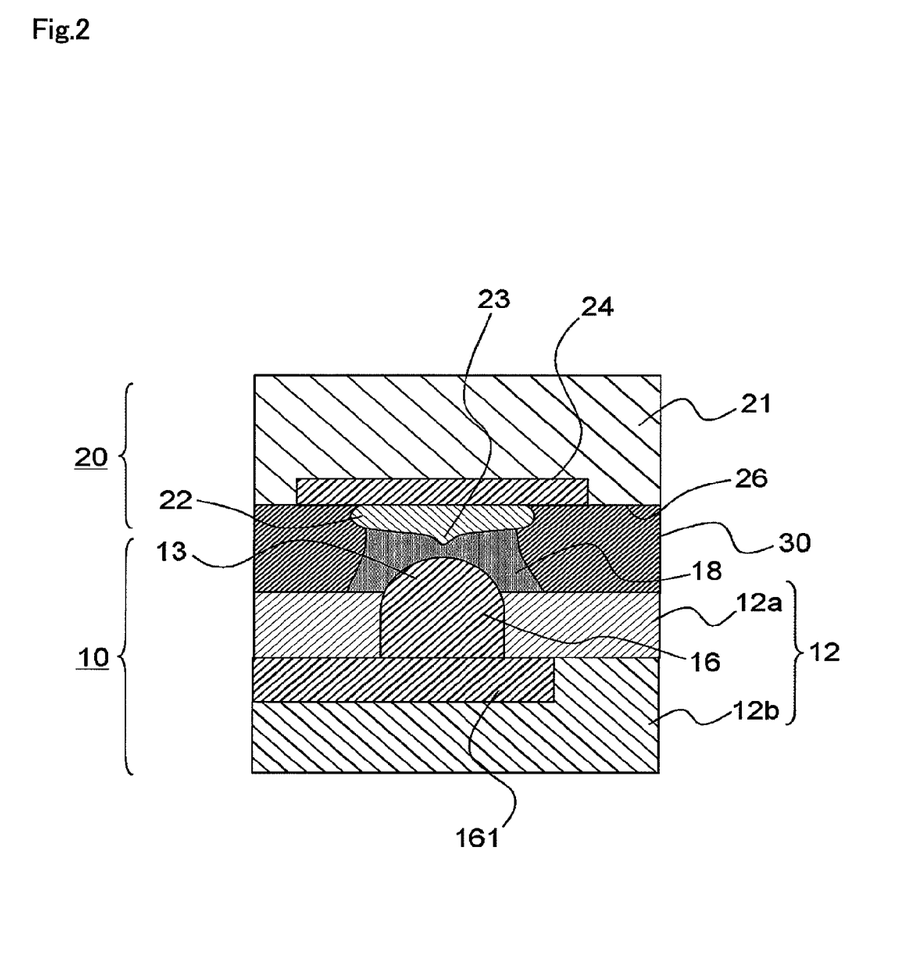
FIG. 2 is an enlarged view of a region represented by circle II in FIG. 1.

FIG. 2 is an enlarged view of a region represented by circle II in FIG. 1.

First, a summary of the electronic component package 100 of this embodiment will be described.

The electronic component package 100 of this embodiment includes a circuit board 10, an electronic component 20 and an adhesive layer 30.

The circuit board 10 is provided with a base member 12, an electrically-conductive conductor post 16 which is buried in the base member 12, and a solder layer 18 which is provided at the front end 13 of the conductor post 16 while exposed from a surface 121 of the base member 12.

The electronic component 20 has an electrode pad 24 having a metal layer 22 mounted thereon provided on a main surface 26 thereof.

The adhesive layer 30 contains a flux activating compound, and bonds the surface 121 of the base member 12 and the main surface 26 of the electronic component 20.

The electronic component package 100 of this embodiment includes the metal layer 22 and the solder layer 18 which are metal-bonded.

Next, the electronic component package 100 of this embodiment will be described in detail.

As the electronic component 20, in addition to a semiconductor element such as a transistor or the like, a resistance element and a condenser may be used. More specifically, the electronic component 20 used in this embodiment is a semiconductor element, while the circuit board 10 is an interposer substrate.

The electronic component 20 serving as a semiconductor element includes a semiconductor circuit formed in the inside of a chip substrate 21 and an electrode pad 24 made of a plurality of metals dispersedly formed while exposed to the main surface 26 at one side (lower side in FIGS. 1 and 2).

The electronic component 20 is mounted on the circuit board 10 by a face-down method.

The circuit board 10 of this embodiment is a flexible printed board.

The circuit board 10 serving as an interposer substrate includes an insulating base member 12 as a main component.

Examples of the material constituting the base member 12 include a fiber base member, a resin film and the like.

Examples of the fiber base member include an inorganic fiber base member such as a glass fiber base member (e.g., a glass woven cloth, a glass non-woven cloth), or a woven or non-woven cloth made of an inorganic compound other than glass; and an organic fiber base member formed from organic fibers made of an aromatic polyamide resin, a polyamide resin, an aromatic polyester resin, a polyester resin, a polyimide resin, a fluororesin, or the like.

Examples of the resin film base member include polyimide resin type films such as a polyimide resin film, a polyether imide resin film, a polyamide-imide resin film and the like; polyamide resin type films such as a polyamide resin film and the like; and polyester resin type films such as a polyester resin film and the like. Among these, polyimide resin type films are generally preferable. Thus, an elastic modulus and heat resistance can be particularly improved, and excellent micro laser processability can be achieved.

Furthermore, the base member 12 may contain an inorganic filler (nanofiller) having a fine particle diameter.

A thickness of the base member 12 is not particularly limited, and it may be, for example, from 5 to 125 μm. In particular, when it is from 12.5 to 100 μm, excellent flexibility in the direction perpendicular to the plane of the base member 12 and stretchability in the in-plane direction can be obtained.

The size in the in-plane direction of the base member 12 is not particularly limited, and it may be smaller than the main surface 26 of the electronic component 20, may be the same size as the main surface 26, or may be greater than the main surface 26. In FIG. 1, illustrating one example, the area of the surface 121 of the base member 12 is smaller than the main surface 26 of the electronic component 20 facing the base member 12, so that a forming region of the base member 12 is included in a forming region of the main surface 26.

In the base member 12, a via hole 125 (refer to FIG. 4) penetrating the base member 12 is formed at a position facing the electrode pad 24 of the electronic component 20. The conductor post 16 is formed in the inside of the via hole 125. Thus, the conductor post 16 is buried in the base member 12.

A metal material may be used for the conductor post 16. Examples of the metal material include metals such as copper, aluminum, indium, tin or the like, and alloys thereof. The conductor post 16 can be produced by paste or an electroplating method.

The front end 13 of the conductor post 16 may be formed in the inside of the base member 12, may be formed to be flush with the surface 121 of the base member 12 or may be formed to protrude from the surface 121.

In this embodiment, the front end 13 of the conductor post 16 protrudes upward from the surface 121 of the base member 12, that is, protrudes towards the electronic component 20.

The solder layer 18 is formed on the front end 13 of the conductor post 16 so as to cover the conductor post 16 partially or entirely. The solder layer 18 is exposed from the surface 121 of the base member 12.

Furthermore, the solder layer 18 may be formed to be flush with the surface 121 of the base member 12, or may be formed to protrude from the surface 121. In this embodiment, the solder layer 18 protrudes from the surface 121 of the base member 12 along with the front end 13 of the conductor post 16.

The electrode pad 24 of the electronic component 20 is mounted by flip chip bonding for electrically connecting in a one-to-one relationship using the solder layer 18 of the conductor post 16.

Furthermore, a metal material layer different from the conductor post 16 may be formed by laminating on the surface of the front end 13 of the conductor post 16 as an under layer of the solder layer 18. Specifically, when the conductor post 16 is made of copper, for example, a nickel-plated layer or an aluminum-plated layer may be formed on the front end 13. Accordingly, since an alloy is formed at the interface between the under layer and the solder layer 18 at the time of formation of the solder layer 18, adhesiveness of the solder layer 18 to the conductor post 16 is enhanced, thus preventing diffusion of the solder layer 18.

The circuit board 10 serving as an interposer substrate may be a single-layer substrate having a single wiring layer formed on its surface or in the inside, or may be a multilayer wiring substrate having a plurality of wiring layers.

In the circuit board 10 of this embodiment, as shown in FIG. 2, the base member 12 is a single-layer substrate which is the combination of a surface base member 12a having the conductor post 16 formed to penetrate therethrough with a back surface base member 12b bonded to its back surface (lower side in FIGS. 1 and 2).

An electrode section 161 which is electrically connected to the conductor post 16 is formed in the inside of the circuit board 10. In this embodiment, one or a plurality of conductor posts 16 are connected by means of the electrode section 161. More specifically, two conductor posts 16 are connected on the electrode section 161 (an electrode section 161a) illustrated at the left side of FIG. 1, while one conductor post 16 is connected on the electrode section 161 (an electrode section 161b) illustrated at the right side of FIG. 1.

On a back surface 122 of the circuit board 10, a ball pad 162 bonded to the electrode section 161 is formed. Then, a solder bump 40 is mounted on the ball pad 162.

Thus, the conductor post 16 and the solder layer 18 are electrically connected to the solder bump 40.

Namely, in the circuit board 10 of this embodiment, the conductor post 16 is connected to the ball pad 162 without using bonding wires.

A positional relationship between the solder bump 40 and the conductor post 16 in the in-plane direction of the electronic component package 100 is not particularly limited. In case of this embodiment illustrated in FIG. 1, in the electrode section 161a, one conductor post 16 (a conductor post 16a) and the solder bump 40 are overlapped with each other in the in-plane direction (lateral direction in the figure), while the other conductor post 16 (a conductor post 16b) and the solder bump 40 are offset to each other.

Figure 3:
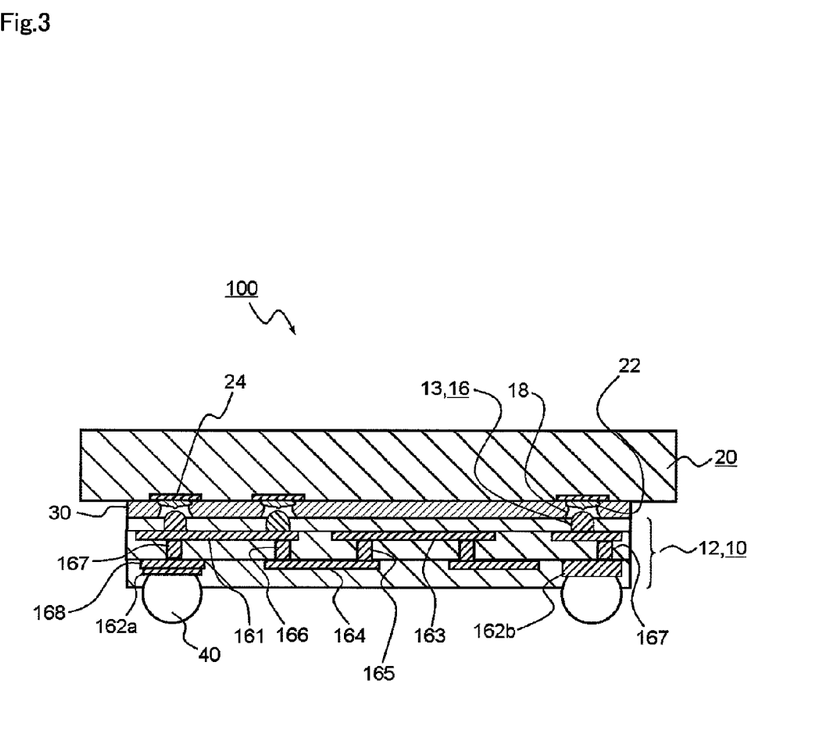
FIG. 3 is a laminated cross-sectional view of an electronic component package according to a modified example of the first embodiment.

Further, as a modified example of this embodiment, FIG. 3 illustrates a laminated cross-sectional view of the electronic component package 100 when a multilayer wiring board is used for the base member 12 of the circuit board 10.

In the electronic component package 100 of this modified example, the circuit board 10 is a multilayer substrate obtained by laminating a plurality of wiring layers 163 and 164 to each other which are electrically connected to the conductor post 16. More specifically, conductive wiring layers 163 and 164 are formed in a multilayer form at the inside of the base member 12 composed of a resin material. Three or more wiring layers may be formed.

The wiring layers are formed separately at predetermined intervals, and are electrically connected by means of a conductive via 165.

The wiring layer 164 and the via 165 are composed of metal materials such as copper, aluminum or the like, similarly to the electrode section 161. The via 165 may be formed, for example, by a plate growing method.

In the modified example, the wiring layer 163 is formed on the same layer with the same material as the electrode section 161.

As shown in FIG. 3, the electrode section 161 and the wiring layer 164 may be electrically connected to each other by means of a via 166.

The ball pad 162 (a ball pad 162a) for mounting the solder bump 40 thereon may be formed on the surface of a pad 168 formed on the same layer as the wiring layer 164. The pad 168 and the electrode section 161 are electrically connected to each other by means of a via 167. Furthermore, the ball pad 162 (a ball pad 162b) may be directly formed on the end surface of the via 167 without using the pad 168. Namely, the ball pad 162 may be formed in a multilayer form, similarly to the ball pad 162a and the pad 168, or may be formed in a single-layer form, similarly to the ball pad 162b.

The vias 166 and 167 may be formed by the same method as that for the via 165.

The solder bump 40 has a nearly spherical shape. The solder bump 40 is a member for mounting the electronic component package 100 to a mounting substrate (not illustrated).

In case of the electronic component package 100 of this embodiment, the conductor post 16 and the electrode section 161 are made of metal materials such as iron, aluminum, stainless steel, copper and the like. Among these, copper is preferable in the light of electric properties.

Further, in case of this embodiment, the ball pad 162 is made of gold.

The metal layer 22 to be mounted on the electrode pad 24 of the electronic component 20 is, in case of this embodiment, a metal stud 22a (refer to FIG. 5) protruding towards the circuit board 10.

Figure 5:
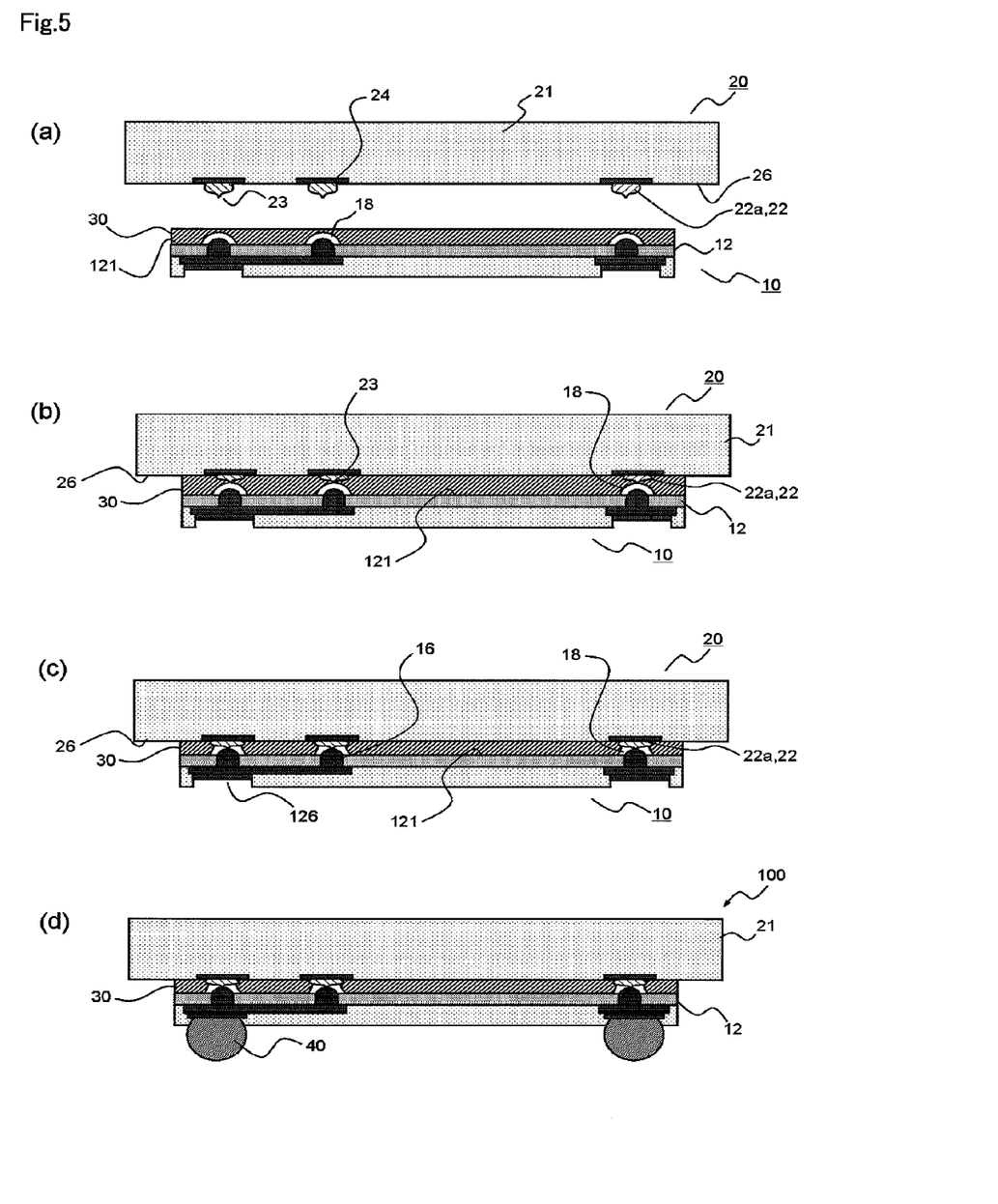

More specifically, the metal stud 22a has a rivet-like shape, and has a protruding section 23 protruding to the direction perpendicular to the plane of the electrode pad 24.

The metal stud 22a may be formed by bonding a melted gold wire to the electrode pad 24.

At least a part of the metal layer 22 (the metal stud 22a) of this embodiment is penetrated into the inside of the solder layer 18.

The depth of the metal layer 22 penetrated into the solder layer 18 is not particularly limited. In FIG. 2, the metal layer 22 is penetrated up to the middle of the solder layer 18, and the front end 13 of the conductor post 16 and the protruding section 23 of the metal layer 22 are not brought into contact with each other. However, in the present invention, the metal layer 22 may be fully penetrated into the solder layer 18 up to the depth where the protruding section 23 reaches the front end 13 of the conductor post 16. As described below, the metal layer 22 and the conductor post 16 are fixed by means of the solder layer 18 while they are brought into contact with each other, whereby reproducibility for the distance in the thickness direction of the circuit board 10 and the electronic component 20 is enhanced.

Then, the solder layer 18 is metal-bonded over the substantially entire surface of the metal stud 22a having the protruding section 23.

The solder layer 18 and the metal layer 22 are composed of metal or alloy materials, and specific components are not restricted. In case of this embodiment, the solder layer 18 contains tin. More specifically, in addition to tin-lead solder, lead-free solder such as tin-silver solder, tin-zinc solder, tin-bismuth solder, tin-antimony solder, tin-silver-bismuth solder, tin-copper solder or the like may be used as the solder layer 18 from the viewpoint of environmental resistance. Also, as the solder layer 18, gold-tin solder may be used.

On the other hand, the metal layer 22 is made of at least one kind of metals selected from gold, nickel, aluminum and copper, an alloy containing the metal, or a solder containing tin. Among these, in this embodiment, gold is used for the metal layer 22 from the viewpoint of low specific resistance.

Herein, tin and gold are pressed to each other during heating at a temperature of about 100 to 200° C., whereby a compound of gold and tin (a gold tin compound: $AuSn$, $AuSn_2$, $AuSn_4$) is formed in a layered format the interface of tin and gold.

In case of the electronic component package 100 of this embodiment, layers of $Au$—$AuSn$—$AuSn_2$—$AuSn_4$—$Sn$ are laminated in this order from the surface of the metal layer 22 penetrated into the inside of the solder layer 18 towards the inside of the solder layer 18, so that the solder layer 18 and the metal layer 22 are firmly metal-bonded to each other.

The adhesive layer 30 containing a flux activating compound is filled in the periphery of the solder layer 18 and the metal layer 22.

The adhesive layer 30 encloses the solder layer 18 and the metal layer 22, and bonds the surface 121 of the circuit board 10 and the main surface 26 of the electronic component 20.

The adhesive layer 30 of this embodiment contains a thermosetting resin as a main component.

Examples of the flux activating compound contained in the adhesive layer 30 include a compound having at least one or more of a carboxyl group and/or a phenolic hydroxyl group in a molecule thereof. Such compounds may be in the form of a liquid or a solid.

Examples of the flux activating compound having a carboxyl group include an aliphatic acid anhydride, an alicyclic acid anhydride, an aromatic acid anhydride, an aliphatic carboxylic acid, an aromatic carboxylic acid and the like. Examples of the flux activating compound having a phenolic hydroxyl group include phenols.

Examples of the aliphatic acid anhydride include a succinic acid anhydride, a polyadipic acid anhydride, a polyazelaic acid anhydride, a polysebacic acid anhydride and the like.

Examples of the alicyclic acid anhydride include a methyl tetrahydrophthalic acid anhydride, a methyl hexahydrophthalic acid anhydride, a methyl himic acid anhydride, a hexahydrophthalic acid anhydride, a tetrahydrophthalic acid anhydride, a trialkyl tetrahydrophthalic acid anhydride, a methyl cyclohexene dicarboxylic acid anhydride and the like.

Examples of the aromatic acid anhydride include a phthalic acid anhydride, a trimellitic acid anhydride, a pyromellitic acid anhydride, a benzophenone tetracarboxylic acid anhydride, ethylene glycol bistrimellitate, glycerol tristrimellitate and the like.

Examples of the aliphatic carboxylic acid include a compound represented by the following formula (I), $$HOOC\text{—}(CH_2)_n\text{—}COOH \quad (1)$$

wherein, in the above formula (I), n is an integer of 0 to 20.

Furthermore, from the viewpoint of balancing a flux activity thereof, an amount of outgases during bonding and a glass transition temperature, n in the above formula (I) is preferably from 3 to 10. By setting n to not less than 3, it is possible to suppress an increase in the elastic modulus after curing so that adhesion between the circuit board 10 and the electronic component 20 is improved. Further, by setting n to not more than 10, it is possible to suppress a decrease in the elastic modulus so that connection reliability is further increased.

Examples of the compound represented by the above formula (I) include glutaric acid (n=3: $HOOC\text{—}(CH_2)_3\text{—}COOH$), adipic acid (n=4: $HOOC\text{—}(CH_2)_4\text{—}COOH$), pimelic acid (n=5: $HOOC\text{—}(CH_2)_5\text{—}COOH$), sebacic acid (n=8: $HOOC\text{—}(CH_2)_8\text{—}COOH$), and $HOOC\text{—}(CH_2)_{10}\text{—}COOH$ (n=10).

Examples of the other aliphatic carboxylic acid include formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, succinic acid and the like.

Examples of the aromatic carboxylic acid include benzoic acid, phthalic acid, isophthalic acid, terephthalic acid, hemimellitic acid, trimellitic acid, trimesic acid, mellophanic acid, prehnitic acid, pyromellitic acid, mellitic acid, triilic acid, xylic acid, hemelitic acid, mesitylenic acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), naphthoic acid derivatives such as 1,4-dihydroxy-2-naphthoic acid and 3,5-dihydroxy-2-naphthoic acid, phenol phthalin, diphenolic acid, and the like.

Examples of the flux activating compound having a phenolic hydroxyl group include monomers each having a phenolic hydroxyl group such as phenol, o-cresol, 2,6-xylenol, p-cresol, m-cresol, o-ethyl phenol, 2,4-xylenol, 2,5-xylenol, m-ethyl phenol, 2,3-xylenol, meditol, 3,5-xylenol, p-tertiarybutyl phenol, catechol, p-tertiaryamyl phenol, resorcinol, p-octyl phenol, p-phenyl phenol, bisphenol A, bisphenol F, bisphenol AF, biphenol, diallyl bisphenol F, diallyl bisphenol A, trisphenol, tetrakisphenol, and the like, a phenol novolak resin, an o-cresol novolak resin, a bisphenol F novolak resin, a bisphenol A novolak resin and the like.

As the flux activating compound, preferably used is a compound containing, in one molecule thereof, at least two phenolic hydroxyl groups which can be added to the epoxy resin, and at least one carboxyl group which is directly bonded to an aromatic ring capable of exhibiting a flux activity with respect to a metal oxide film because it is introduced into a three-dimensional chemical structure by reacting with a thermosetting resin such as an epoxy resin. Examples of the compound include benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, gallic acid (3,4,5-trihydroxybenzoic acid) and the like; naphthoic acid derivatives such as
1,4-dihydroxy-2-naphthoic acid,
3,5-dihydroxy-2-naphthoic acid,
3,7-dihydroxy-2-naphthoic acid and the like; phenol phthalin; diphenolic acid; and the like.

These flux activating compounds may be used singly or in combination of two or more kinds.

It is preferable that the above-mentioned adhesive layer 30 containing a flux activating compound further preferably contains a polyfunctional epoxy resin (a) having three or more glycidyl ether groups with an epoxy equivalent of 100 to 300, a carboxyl-containing compound (b) having a melting point of from 50 to 230° C., and a curing agent (c). Thus, it is possible to obtain the adhesive layer 30 excellent in heat-resistant reliability.

The polyfunctional epoxy resin (a) is not particularly limited, and examples thereof include phenol novolak epoxy resins, cresol novolak epoxy resins, glycidyl amine type epoxy resins, aminotriazine phenol novolac epoxy resins, aminotriazine cresol novolac epoxy resins, naphthalene skeletal type epoxy resins, and cyclopentadiene type epoxy resins, which can be used alone or in combination. Among these, preferably used are naphthalene skeletal type tetrafunctional epoxy resins, glycidyl amine type trifunctional epoxy resins and trifunctional solid epoxy resins.

The content of the polyfunctional epoxy resin (a) is not particularly limited, and it is preferably from 60 parts by weight to 80 parts by weight, based on 100 parts by weight of the total of the polyfunctional epoxy resin (a) and the curing agent (c). When the content is within this range, the adhesive layer 30 is excellent in adhesiveness.

The carboxyl-containing compound (b) has an effect of removing an oxide film formed on the surfaces of the solder layer 18, the metal layer 22 (the metal stud 22a) and the electrode pad 24 in some cases to improve wettability.

Maximum activation of the compound (b) is exhibited at a time of exceeding the melting point, so that the melting point of the compound (b) is preferably not more than 230° C. Also, by setting the melting point to not less than 50° C., outflow of the compound (b) from the adhesive layer 30 can be prevented.

The content of the compound (b) is preferably from 3 parts by weight to 15 parts by weight, based on 100 parts by weight of the total of the polyfunctional epoxy resin (a), the compound (b) and the curing agent (c). When the content is within this range, the metal surface can be adequately reduced by the compound, resulting in satisfactory metal-bonding. Furthermore, when the adhesive layer 30 is used as a sheet carrier material, it can be favorably handled.

The compound (b) is not particularly limited, and examples thereof include 2,3-pyrazinedicarboxylic acid, cyclohexanedicarboxylic acid, cyclobutanedicarboxylic acid, benzoic acid, m-methylbenzoic acid, p-methylbenzoic acid, coumarin-3-carboxylic acid, benzophenone-2-carboxylic acid, sebacic acid, 1,2,3,4-cyclopentanetetracarboxylic acid, 2-biphenylcarboxylic acid, 4-biphenylcarboxylic acid and the like, which can be used alone or in combination of two or more kinds.

The adhesive layer 30 may further contain a synthetic rubber elastomer. Thus, when it is used as a sheet carrier material, the adhesive layer 30 is excellent in film processability. The synthetic rubber elastomer which is carboxylic acid-modified may be preferably used because its adhesiveness to a polyimide film is improved. For example, it may be a common rubber such as a carboxylic-acid-modified NBR, a carboxylic-acid-modified acrylic rubber and a carboxylic-acid-modified butadiene rubber which are commercially available.

The content of the synthetic rubber elastomer is not particularly limited, and it is preferably from 5 parts by weight to 30 parts by weight, based on 100 parts by weight of the total of the polyfunctional epoxy resin (a), the synthetic rubber elastomer and the curing agent (c). When the content is within this range, the adhesive layer 30 in which adhesiveness and heat resistance are well-balanced can be provided. Furthermore, a weight average molecular weight of the synthetic rubber elastomer is preferably not less than 500,000. Thus, the adhesive layer 30 exhibiting excellent moldability in pressing with heating can be provided.

The adhesive layer 30 may contain a novolac phenol resin as a curing agent (c). The novolac phenol resin is not particularly limited, and preferable examples thereof include aminotriazine novolac type phenol resins and aminotriazine cresol novolac type phenol resins. The presence of an amino group causes a reaction of some epoxy groups due to heat during application, leading to B stage. Thus, outflow during laminating press can be prevented. Furthermore, nitrogen in the triazine moiety contributes to flame retardancy.

The content of the novolac phenol resin is not particularly limited, but it is preferably from 0.8 to 1.2 equivalents based on the polyfunctional epoxy resin (a). When the equivalent is within this range, the adhesive layer 30 is excellent in curability and warpage.

The adhesive layer 30 can further contain a coupling agent for improving adhesiveness, a defoamer or a leveling agent for minimizing foaming and repelling during application, a small amount of a curing accelerator for adjusting a gelling time, an inorganic filler or the like.

A second preferable adhesive layer 30 contains a resin (A) having a phenolic hydroxy group such as a phenol novolac resin, a cresol novolac resin, an alkylphenol novolac resin, a resol resin, a polyvinylphenol resin and the like, and a curing agent (B) for the resin (A).

Examples of the curing agent include epoxy resins prepared by epoxidation of a phenolic base such as a bisphenol, a phenol novolac, an alkylphenol novolac, a biphenol, a naphthol and a resorcinol compound or a base having an aliphatic, alicyclic or unsaturated aliphatic skeleton, or an isocyanate compound.

The amount of the resin (A) to be mixed is preferably from 20 parts by weight to 80 parts by weight, based on the total weight of the adhesive layer 30. When it is not less than 20 parts by weight, a function of cleaning a metal surface is excellent. When it is not more than 80 parts by weight, an adequately cured product can be obtained.

On the other hand, the amount of the resin or the compound acting as a curing agent (B) is preferably from 20 parts by weight to 80 parts by weight, based on the total weight of the adhesive layer 30. The adhesive layer 30 may contain, if necessary, a coloring agent, an inorganic filler, various coupling agents, a solvent or the like.

A third preferable adhesive layer 30 contains an epoxy resin (C) prepared by epoxidation of a phenolic base such as a bisphenol, a phenol novolac, an alkylphenol novolac, a biphenol, a naphthol and a resorcinol compound or a base having an aliphatic, alicyclic or unsaturated aliphatic skeleton; a curing agent (D) for the above epoxy resin (C) which has an imidazole ring; and a curable antioxidant (E).

For the epoxy resin (C), the material common to the above-mentioned polyfunctional epoxy resin (a) may be used.

Examples of the curing agent (D) include imidazole, 2-methylimidazole, 2-ethyl-4-methylimidazole, 2-phenylimidazole, 1-benzyl-2-methylimidazole, 2-undecylimidazole, 2-phenyl-4-methylimidazole, bis(2-ethyl-4-methyl-imidazole) and the like.

The curable antioxidant (E) is a compound which acts as an antioxidant and can react with a curing agent to be cured, and examples thereof include compounds having a benzylidene structure, 3-hydroxy-2-naphthoic acid, pamoic acid, 2,4-dihydroxybenzoic acid, 2,5-dihydroxybenzoic acid and the like.

The amount of the epoxy resin (C) to be mixed is preferably from 30 parts by weight to 99 parts by weight, based on the total weight of the adhesive layer 30. When it is not less than 30 parts by weight, an adequately cured product can be produced.

In addition to the above two components, the adhesive layer may contain a thermosetting resin such as a cyanate resin, an acrylic acid resin, a methacrylic acid resin and a maleimide resin or a thermoplastic resin. Furthermore, it may contain, if necessary, a coloring agent, an inorganic filler, various coupling agents, a solvent or the like.

The amount of the curing agent (D) and the curable antioxidant (E) to be mixed in combination is preferably from 1 part by weight to 20 parts by weight, based on the total weight of the adhesive layer 30. By setting the amount to not less than 1 part by weight, a function of cleaning the surfaces of the solder layer 18, the metal layer 22 and the electrode pad 24 is obtained, and the curability of the epoxy resin (C) is excellent. And, by setting to amount to not more than 10 parts by weight, the curing reaction proceeds so mildly that the adhesive layer 30 having high fluidity can be obtained. Further, the curing agent (D) and the curable antioxidant (E) may be used together, or only one of the components may be mixed singly prior to use.

The adhesive layer 30 can be prepared by, for example, dissolving a solid resin (A) and a resin (B) in a solvent; dissolving a solid resin (A) in a liquid resin (B); dissolving a solid resin (B) in a liquid resin (A); or dissolving or dispersing a curing agent (D) and a curable antioxidant (E) in a solution of a solid epoxy resin (C) dissolved in a solvent.

Examples of a solvent in use include acetone, methyl ethyl ketone, methyl isobutyl ketone, cyclohexane, toluene, butyl cellosolve, ethyl cellosolve, N-methylpyrrolidone, γ-butyrolactone and the like. The solvent preferably has a boiling point of not more than 200° C.

Method for Producing Electronic Component Package

The method for producing the electronic component package 100 of the embodiment (hereinafter referred to as the method in some cases) will be described below.

First, a summary of the method will be described.

The method includes a first preparation step, a second preparation step, a step of forming an adhesive layer, a step of aligning the position, and a bonding step.

The first preparation step refers to a step of preparing the circuit board 10 including the base member 12, the electrically-conductive conductor post 16 which is buried in the base member 12, and the solder layer 18 which is provided at the front end 13 of the conductor post 16 while exposed from the surface 121 of the base member 12.

The second preparation step includes a step of preparing the electronic component 20 in which the electrode pad 24 having the metal layer 22 mounted thereon is formed on the main surface 26.

The step of forming an adhesive layer refers to a step of attaching the adhesive layer 30 containing a flux activating compound to at least one of the surface 121 of the circuit board 10 and the main surface 26 of the electronic component 20, thus covering the solder layer 18 or the metal layer 22.

The step of aligning the position refers to a step of bringing the circuit board 10 and the electronic component 20 into pressure contact with each other in a heated state while the conductor post 16 and the electrode pad 24 are opposed to each other, thus bonding the circuit board 10 and the electronic component 20 by means of the adhesive layer 30, and at the same time aligning the positions of the solder layer 18 and the metal layer 22.

The bonding step refers to a step of heat-melting the solder layer 18 for metal-bonding the solder layer 18 and the metal layer 22.

Furthermore, the method may further include a step of dicing the electronic component package 100 obtained by bonding the electronic component 20 to the circuit board 10 in the bonding step into pieces (refer to FIGS. 6 and 7), and a step of mounting the solder bump 40 on the circuit board 10 (the step of mounting a bump).

Next, the method will be described in more detail.

Figure 4:
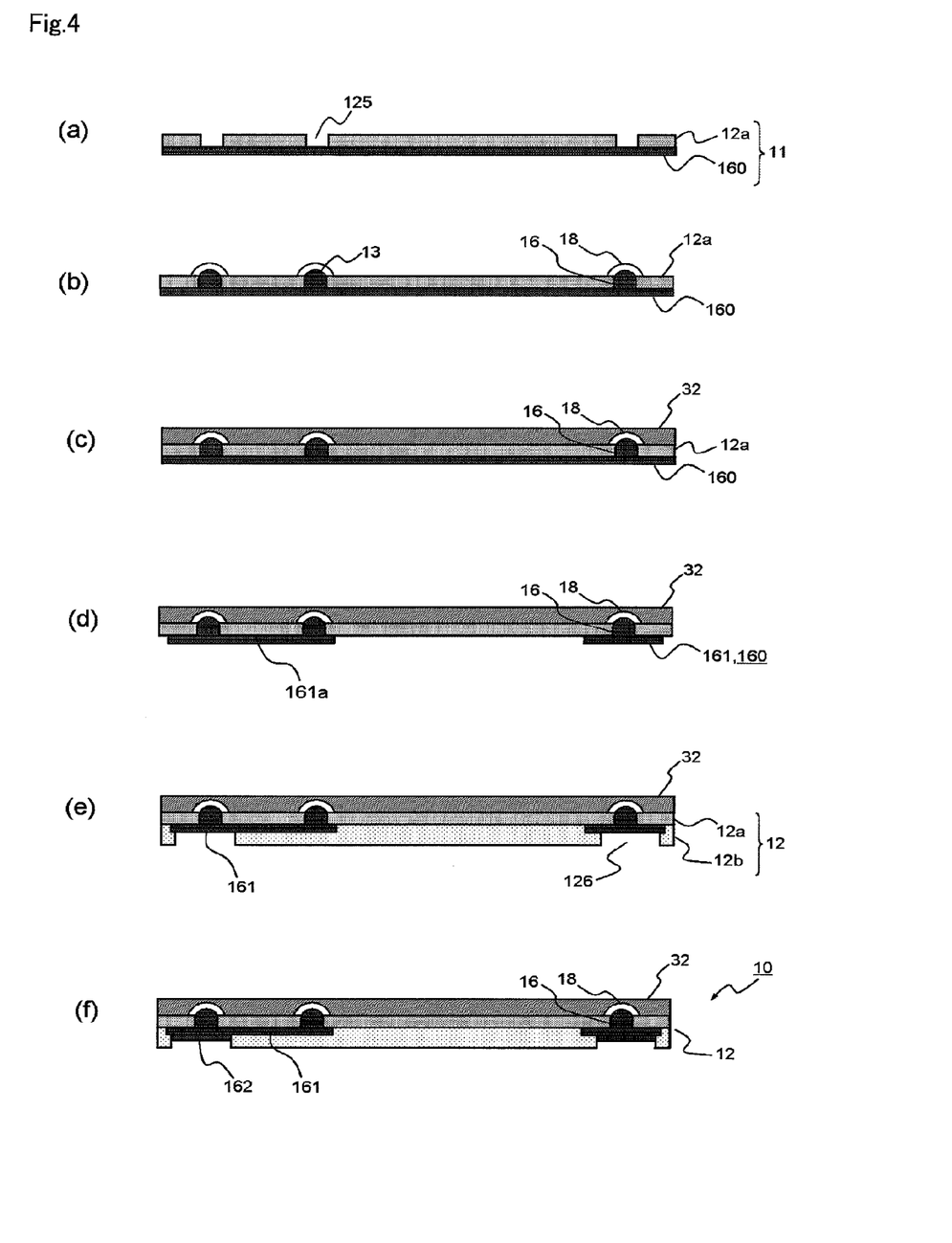
FIG. 4 ((a) to (f)) is a process cross-sectional view illustrating a first preparing step.

FIG. 4 ((a) to (f)) is a process cross-sectional view illustrating the first preparation step.

FIG. 5 (a) is a cross-sectional view illustrating a state in which the step of forming the adhesive layer on the circuit board 10 is carried out. FIG. 5 (b) is a cross-sectional view illustrating the step of aligning the position. FIG. 5 (c) is a cross-sectional view illustrating the bonding step. FIG. 5 (d) is a cross-sectional view illustrating the step of mounting a bump.

The circuit board 10 of this embodiment is prepared on the basis of a one-sided board 11 illustrated in FIG. 4 (a). The one-sided board 11 is a copper-clad laminate in which a copper foil 160 is attached to a back surface of an insulating surface base member 12a.

A thickness of the copper foil 160 is preferably from 5 to 35 μm.

As the one-sided board 11, for example, LαZ manufactured by Sumitomo Bakelite Co., Ltd. may be used.

The via holes 125 are formed by using laser treatment on the surface base member 12a at predetermined intervals in a predetermined number. The via hole 125 is formed at the depth where the copper foil 160 is exposed from the surface of the surface base member 12a.

Next, as shown in FIG. 4 (b), a conductor post 16 for filling in the via hole 125 partially or entirely is formed by applying a metal paste or using an electrolytic plating method. The conductor post 16 is formed at a state that the front end 13 is recessed from the surface of the via hole 125, formed to be flush with the surface or formed to protrude from the surface. In FIG. 4 (b) illustrating an example, the conductor post 16 is formed higher than the thickness of the surface base member 12a in order that the front end 13 protrudes to the surface from the via hole 125. The front end 13 of the conductor post 16 protrudes from the surface base member 12a, so that the metal layer 22 and the conductor post 16 are brought into contact with each other in the bonding step to be described below without depending on the thickness or shape of the metal layer 22, and reproducibility for the distance in the thickness direction of the circuit board 10 and the electronic component 20 can be enhanced.

The shape of the front end 13 of the conductor post 16 is not particularly limited. The hemispherical front end 13 is schematically illustrated in FIG. 4 (b), but it may be cylindrical or prism-shaped. Furthermore, the front end 13 may be a normal-taper shape of a dovetail shape increasing the diameter towards the surface base member 12a, or a reverse-taper shape of a drinking-cup shape reducing the diameter towards the surface base member 12a.

As shown in FIG. 4 (b), the solder layer 18 is attached to the surface of the front end 13 of the conductor post 16 protruding from the surface base member 12a. A thickness of the solder layer 18 is not particularly limited, but it is from 0.5 to 30 μm, and preferably from 1 to 20 μm. By setting the thickness of the solder layer 18 to not less than 0.5 μm, poor connection of the solder layer 18 to the metal layer 22 is not susceptible to occurring even though irregularities in the thickness of the solder layer 18 attached to the front end 13 of the conductor post 16 is temporarily caused. On the other hand, by setting the thickness of the solder layer 18 to not less than 1 μm, the solder layer 18 is secured to be fully connected to the other region as well as the region in the vicinity of the protruding section 23 when the metal layer 22 is the rivet-like metal stud 22a.

Next, as shown in FIG. 4 (c), a protective layer 32 is applied on the surface of the surface base member 12a, or formed by lamination or the like, thus coating and protecting the solder layer 18 formed on the conductor post 16.

The solder layer 18 is formed while exposed from the surface base member 12a. That is, the solder layer 18 may be formed to protrude from the surface base member 12a as shown in FIG. 4 (c), may be formed to be flush with the surface base member 12a, or may be formed in the inside of the surface base member 12a (the via hole 125).

Next, as shown in FIG. 4 (d), the copper foil 160 is subjected to etching to form a predetermined pattern, whereby the electrode section 161 is formed. Thus, a plurality of the conductor posts 16 (two in FIG. 4 (d)) are connected to each other by means of the electrode section 161 (the electrode section 161a). Furthermore, the electrode section 161 may be formed by etching, and in addition thereto, may be formed by an additive process for selectively piling the electrode section 161 on the surface of the surface base member 12a, may be formed by a semi-additive process for piling the electrode section 161 by electrodeposition on a conductive sheet layer (not illustrated in the figure) formed by patterning on the surface of the surface base member 12a, or may be formed by a printing method.

Subsequently, as shown in FIG. 4 (e), a back surface base member 12b is formed on the surface of the etched electrode section 161 (lower surface in the figure). The back surface base member 12b constitutes the base member 12 along with the surface base member 12a.

The back surface base member 12b and the surface base member 12a may be composed of the same materials or different materials.

An opening 126 is formed on the back surface base member 12b. The opening 126 is formed at the depth where the electrode section 161 is exposed.

Formation of the opening 126 on the back surface base member 12b may be carried out according to various methods. Examples of the method include (i) an etching method in which a resin composition for the back surface base member 12b is applied all over the surface of the surface base member 12a (lower surface in the figure), which is then subjected to etching to form a pattern of the opening 126; and (ii) a printing method in which the back surface base member 12b is coated so as to form the opening 126 in advance.

Herein, in (i) the etching method, a photosensitive material may be used as a resin composition for the back surface base member 12b to form a pattern of the opening 126 by the photolithography method. Or, a pattern of a resist layer may be formed on the surface of the coated and cured back surface base member 12b by the printing method, and an opening part facing the resist layer may be removed by etching so that the opening 126 is formed. Various methods for etching may be used, and examples include dry etching, wet etching, laser etching and the like.

In addition, as (ii) the printing method, for example, a screening method may be used.

As shown in FIG. 4 (f), the surface of the electrode section 161 is subjected to gold plating, whereby the ball pad 162 is formed in the inside of the opening 126.

The circuit board 10 is prepared according to the above-mentioned step.

The electronic component 20 illustrated in FIG. 5 (a) is prepared according to the second preparation step. The electronic component 20 used in this method is a face down type semiconductor element such as flip chip or the like, and an explanation of the detailed preparation method will be omitted.

Any of the first preparation step and the second preparation step may be carried out first, or both steps may be carried out at a time. Further, in this method, carrying out a plurality of steps at a time means that a part of two steps or the entire two steps are carried out at an overlapping timing.

The rivet-like metal stud 22a is formed on the electrode pad 24 formed while exposed to the main surface 26 of the chip substrate 21. The protruding section 23 of the metal stud 22a protrudes downward in the figure, that is, in the direction perpendicular to the plane of the chip substrate 21.

Further, the adhesive layer 30 containing a flux activating compound may be arranged on the main surface 26 of the chip substrate 21.

In the circuit board 10, the adhesive layer 30 is attached to the surface 121 of the base member 12 by peeling off the protective layer 32 (refer to FIG. 4 ((c) to (f))).

The adhesive layer 30 is attached to the substantially entire surface 121 of the base member 12 so as to fully cover the solder layer 18.

More specifically, in the step of forming an adhesive layer, the uncured adhesive layer composition containing a thermo-setting epoxy resin is applied all over the surface 121 of the base member 12, or the adhesive layer 30 formed into a film is attached to the surface 121 of the base member 12.

Furthermore, the step of forming an adhesive layer may be carried out along with the first preparation step as one unit step.

The circuit board 10 and the electronic component 20 are arranged to face each other with the adhesive layer 30 and the metal stud 22a directed inwardly such that the protruding direction of the solder layer 18 is directed to the electrode pad 24.

In the step of aligning the position illustrated in FIG. 5 (b), the metal stud 22a and the solder layer 18 are aligned to each other by relatively driving the circuit board 10 and the electronic component 20 arranged to face each other in the plane direction and in the direction perpendicular to the plane. The step of aligning the position is carried out in a heated state at a temperature of about 60 to 150° C. At such a temperature (alignment temperature), the solder layer 18 is in a solid state, and the adhesive layer 30 is in an active state for adhesion. Also, such a temperature is lower than the curing temperature of the adhesive layer 30.

Furthermore, in the step of aligning the position, by pressing the circuit board 10 and the electronic component 20, the metal stud 22a is penetrated into the inside of the adhesive layer 30, and reaches the vicinity of the surface of the solder layer 18.

In the step of aligning the position, the circuit board 10 and the electronic component 20 may be brought into pressure contact with each other until the metal layer 22 and the solder layer 18 are brought into contact, or the metal layer 22 may be penetrated into the adhesive layer 30 up to the depth where the metal layer 22 and the solder layer 18 are not brought into contact with each other.

Furthermore, in the step of aligning the position, when the metal layer 22 and the solder layer 18 are brought into contact with each other, the metal layer 22 may be penetrated into the solder layer 18. The step of aligning the position of this embodiment is carried out at a temperature of less than the melting point of the solder layer 18, so that a part of the protruding section 23 can be penetrated into the solder layer 18 by a pressing force in the step of aligning the position particularly when the metal layer 22 is the metal stud 22a, due to low rigidity of the solder alloy constituting the solder layer 18.

The bonding step illustrated in FIG. 5 (c) is carried out while the circuit board 10 and the electronic component 20 are heated at a reflow temperature of about 150 to 250° C., and brought into pressure contact with each other. The reflow temperature is higher than the alignment temperature, and refers to a melting or softening temperature of the solder layer 18. Heating to the reflow temperature can be carried out by means of heat transfer or ultrasonic wave.

The reflow temperature is preferably from −10 to +30° C. of the melting point of the solder layer 18. When the temperature is from −10° C. of the melting point of the solder layer 18 to the melting point, the metal stud 22a can be penetrated into the solder layer 18 as the solder layer 18 is softened. Further, when the reflow temperature is selected from the range of the melting point of the solder layer 18 to +30° C. of the melting point, the solder layer 18 is melted. Herein, the periphery of the solder layer 18 is surrounded by the adhesive layer 30 and the metal layer 22 (or the electrode pad 24) as shown in FIG. 2, while the melted solder layer 18 has higher wettability to the metal layer 22 made of a metal material than the peripheral adhesive layer 30. Accordingly, the melted solder layer 18 covers the surface of the metal layer 22.

In the bonding step, the adhesive layer 30 is thermally cured. Reflow of the solder layer 18 and thermal curing of the adhesive layer 30 may be carried out at the same time, or the adhesive layer 30 may be thermally cured after the reflowed solder layer 18 is re-solidified.

Namely, in the bonding step, even though the circuit board 10 and the electronic component 20 are kept at a predetermined reflow temperature, melting of the solder layer 18 and thermal curing of the adhesive layer 30 may be carried out at a time, or reflow of the solder layer 18 and thermal curing of the adhesive layer 30 may be carried out in order by changing the temperature at multiple stages during the bonding step. In the latter case, the thermal curing temperature of the adhesive layer 30 may be selected from the range of 120 to 190° C., and the thermal curing temperature may be less than the melting point of the solder layer 18.

Then, by setting the thermal curing temperature of the adhesive layer 30 to less than the reflow temperature of the solder layer 18, it is possible to reduce a thermal load to the adhesive layer 30 during thermal curing.

In the bonding step, at least a part of the metal layer 22 (the metal stud 22a) is penetrated into the inside of the solder layer 18, and at the same time the adhesive layer 30 is attached to the main surface 26 of the electronic component 20.

The depth where the metal stud 22a is penetrated into the solder layer 18 is not particularly limited. The front end of the protruding section 23 may be penetrated up to the middle of the solder layer 18, or may be penetrated up to the surface of the conductor post 16. Also, the metal stud 22a may be penetrated into the solder layer 18 up to the depth where the metal stud 22a is pressed to the conductor post 16 and its shape is changed.

Herein, as shown in FIG. 5 (c), the front end of the protruding section 23 is penetrated up to the surface of the conductor post 16, whereby the distance in the thickness direction of the circuit board 10 and the electronic component 20 is determined depending on the projection heights of the protruding section 23 and the conductor post 16 which are bonded. Thus, reproducibility for the distance in the thickness direction of the circuit board 10 and the electronic component 20 per the electronic component package 100 is enhanced, and the thickness of the electronic component package 100 is rendered uniform.

An intercalation compound is generated and grown at the interface between the solder layer 18 and the metal layer 22 pressurized at the bonding temperature.

The solder layer 18 of this method contains tin, and gold is used for the metal layer 22. For this reason, a gold-tin compound is formed in a layered form at the interface between the solder layer 18 and the metal layer 22, and the solder layer 18 and the metal layer 22 are metal-bonded. Thus, the circuit board 10 and the electronic component 20 are firmly integrated into one body.

The step of mounting a bump illustrated in FIG. 5 (d) is carried out by mounting the solder bump 40 on the opening 126 (refer to FIG. 5 (c)) according to a known method. A detailed explanation will be omitted.

As described above, the electronic component package 100 of this embodiment illustrated in FIG. 1 is prepared.

In this method, a plurality of electronic component packages 100 may be prepared by a so-called multiple attachment.

Figure 6:
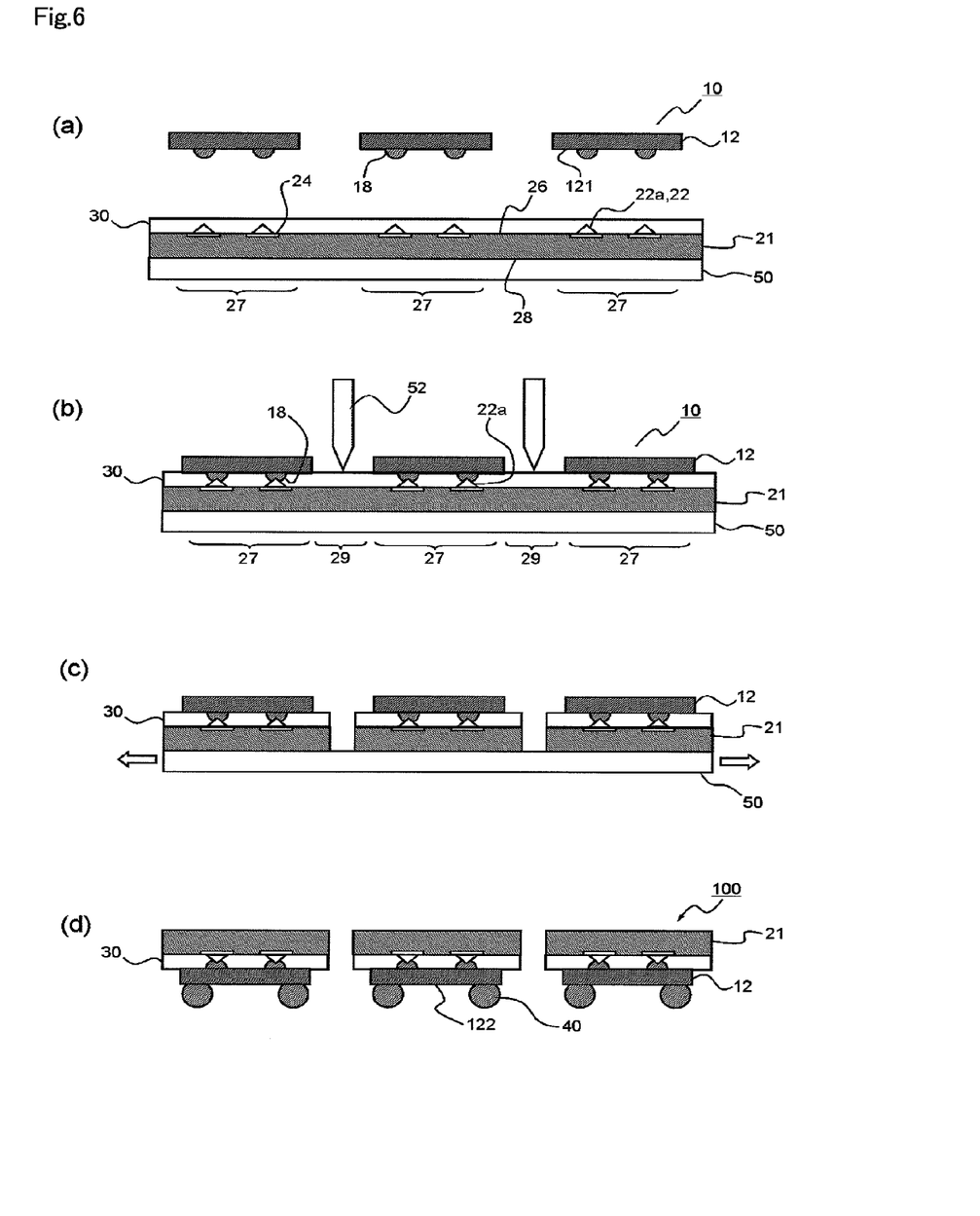
FIG. 6 ((a) to (d)) is a process cross-sectional view of a method for producing an electronic component package according to a first modified example.
Figure 7:
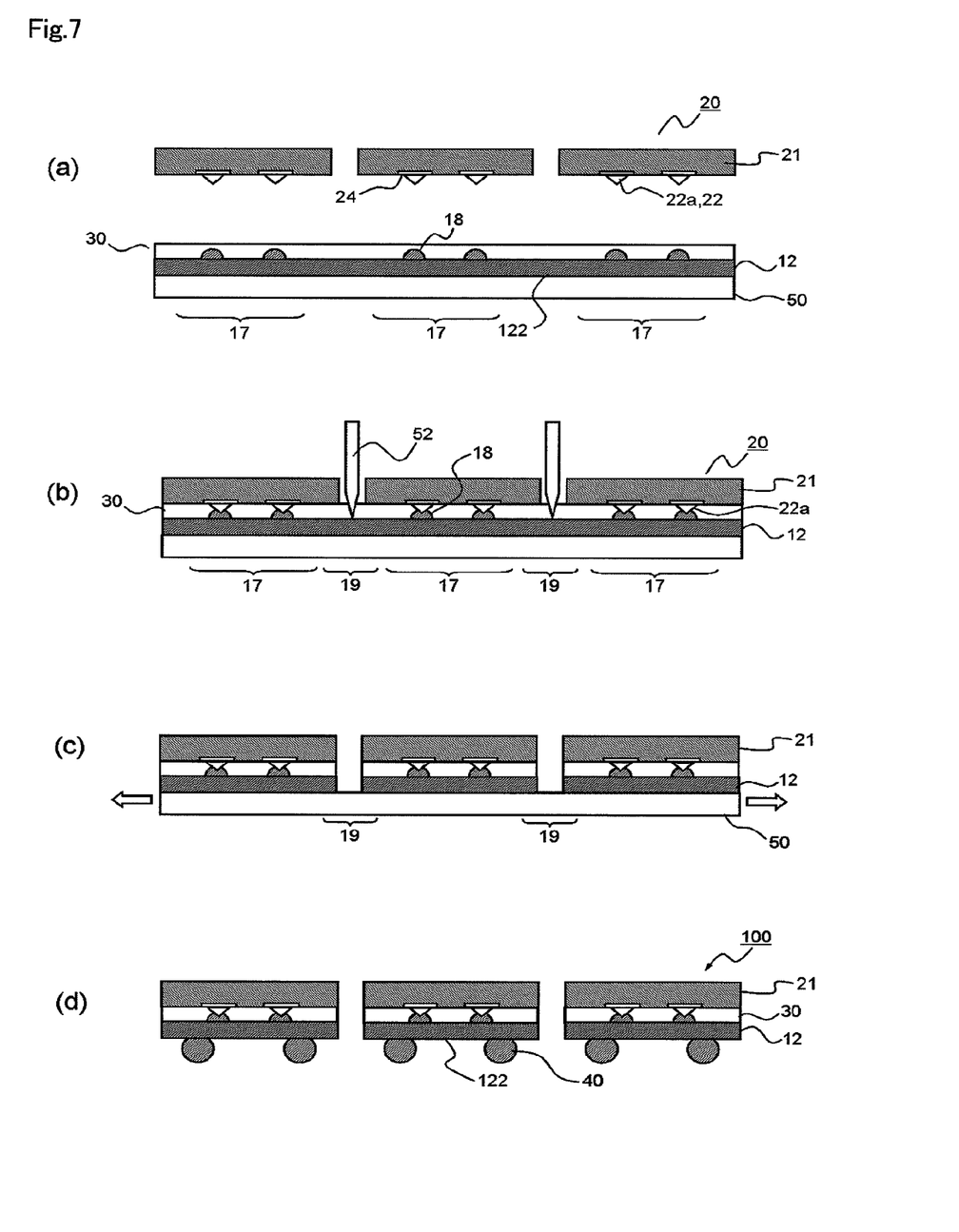
FIG. 7 ((a) to (d)) is a process cross-sectional view of a method for producing an electronic component package according to a second modified example.

Each of FIGS. 6 and 7 includes a step of dicing the multiple electronic component packages 100 into pieces, and is a process cross-sectional view schematically illustrating a modified example of this method.

FIG. 6 ((a) to (d)) is a process cross-sectional view according to a first modified examples of this method, in which a plurality of circuit boards 10 which are segmented into pieces in advance are bonded to a single sheet of the chip substrate 21.

A plurality of element regions 27 are one-dimensionally or two-dimensionally formed by patterning on the chip substrate 21 illustrated in FIG. 6 (a). One or two or more electrode pads 24 are arranged on respective element regions 27. Each of the metal studs 22a is mounted on the electrode pad 24.

The adhesive layer 30 is attached to the main surface 26 of the chip substrate 21. The electrode pad 24 and the metal stud 22a are covered with the adhesive layer 30 so that oxidation of the surface is prevented.

A stretchable dicing sheet 50 is attached on the lower surface 28 (opposite to the main surface 26) of the chip substrate 21.

On the other hand, in the segmented circuit board 10, the conductor post 16 (not illustrated in this figure) protrudes from the surface 121 of the base member 12, and the solder layer 18 is arranged on its surface.

As shown in FIG. 6 (b), a plurality of circuit boards 10 are aligned to the chip substrate 21 and bonded thereto. The solder layer 18 is penetrated into the adhesive layer 30 and is brought into contact with the metal stud 22a, and a part of the metal stud 22a is further penetrated into the solder layer 18.

The bonding may be carried out at a temperature of not more than the melting temperature of the solder layer 18.

Then, the solder layer 18 and the adhesive layer 30 are heated at a predetermined reflow temperature which is higher than the melting temperature of the solder layer 18, whereby the solder layer 18 and the metal stud 22a are solder-bonded, and at the same time the adhesive layer 30 is thermally cured, thus bonding the chip substrate 21 and the base member 12.

In this state, dicing regions 29 are cut respectively between the element regions 27 by means of a dicing blade 52.

In the dicing step, the chip substrate 21 is diced up to the middle of the dicing sheet 50.

Herein, the chip substrate 21 is diced with a width size of a part of the dicing regions 29, whereby, as shown in FIGS. 6(c) and (d), it is possible to make the area of the chip substrate 21 larger than the area of the base member 12 in the electronic component package 100.

As shown in FIG. 6 (c), the diced chip substrates 21 are segmented into pieces, if necessary, by expanding the dicing sheet 50 in the in-plane direction as illustrated by arrows.

The chip substrates 21 thus segmented are separated from the dicing sheet 50, and then, as shown in FIG. 6 (d), the solder bump 40 is mounted on the back surface 122 of the base member 12 to prepare the electronic component package 100.

Also, in the first modified example of this method, after the bonding step and before the dicing step, the solder bump 40 may be mounted on the back surface 122 of the base member 12 in the circuit board 10 in advance.

FIG. 7 ((*a*) to (*d*)) is a process cross-sectional view according to a second modified example of this method, in which a plurality of electronic components 20 previously segmented into pieces are bonded to a single sheet of the base member 12 in which a plurality of circuit regions 17 are formed by patterning.

A plurality of circuit regions 17 are one-dimensionally or two-dimensionally formed by patterning on the base member 12 illustrated in FIG. 7 (*a*). One or two or more conductor posts 16 (not illustrated in the figure) are arranged on respective circuit regions 17. Each of the solder layers 18 is arranged on the front end of the conductor post 16.

Then, the adhesive layer 30 is attached to the surface 121 of the base member 12. The solder layer 18 is covered with the adhesive layer 30 so that oxidation of the surface is prevented.

The dicing sheet 50 is bonded to the back surface 122 of the base member 12.

On the other hand, the electrode pad 24 and the metal layer 22 (the metal stud 22*a*) are respectively arranged on the segmented electronic components 20.

The electronic component 20 and the base member 12 are arranged to face each other with the metal stud 22*a* and the solder layer 18 directed inwardly.

As shown in FIG. 7 (*b*), a plurality of electronic components 20 heated at a predetermined bonding temperature are aligned to the base member 12 and bonded thereto. The metal stud 22*a* is penetrated into the adhesive layer 30 and the solder layer 18.

Then, the solder layer 18 and the adhesive layer 30 are further heated at a high reflow temperature, whereby the solder layer 18 and the metal stud 22*a* are solder-bonded, and the base member 12 and the chip substrate 21 are bonded by means of the adhesive layer 30.

In this state, the adhesive layer 30 and the base member 12 are cut in the dicing region 19 between the circuit regions 17 by means of a dicing blade 52.

Herein, the base member 12 is cut by adjusting the dicing width so as to be brought into contact with the chip substrate 21 using the dicing blade 52, whereby, as shown in FIGS. 7 (*c*) and (*d*), the areas of the chip substrate 21 and the base member 12 in the electronic component package 100 can be equal to each other.

Then, as shown in FIG. 7 (*c*), the base member 12 is segmented into pieces, if necessary, by expanding the dicing sheet 50 in the in-plane direction as illustrated by arrows.

The base members 12 thus segmented are separated from the dicing sheet 50, and then, as shown in FIG. 7 (*d*), the solder bump 40 is mounted on the back surface 122 of the base member 12 to prepare the electronic component package 100.

Also, in this method, in addition to the above modified examples, the base members 12 and chip substrates 21 in which a plurality of circuit regions 17 and a plurality of element regions 27 are respectively formed by patterning may be bonded to each other, and the base member 12 and the chip substrate 21 may be diced.

The operational effects of the electronic component package 100 of this embodiment as described above will be explained. For the electronic component package 100 of this embodiment, the surfaces of the solder layer 18 and the metal layer 22 are reduced because of the flux activating compound contained in the adhesive layer 30, so that an oxide film is not formed. For this reason, the solder layer 18 and the metal layer 22 are well metal-bonded so that the conductor post 16 and the electrode pad 24 are integrated into one body with a high bonding strength.

In this embodiment, the solder layer 18 contains tin, and the metal layer 22 is made of at least one kind of metals selected from gold, nickel, aluminum and copper, an alloy containing the metal, or a solder containing tin. Thus, when the solder layer 18 and the metal layer 22 are heated by heating the solder layer 18 in a semi-melted state, an intercalation compound is generated at the interface thereof, thus achieving strong metal-bonding.

The metal layer 22 of this embodiment is the metal stud 22*a* protruding towards the circuit board 10. Thus, when the circuit board 10 and the electronic component 20 are pressurized, the rivet-like protruding section 23 is easily penetrated into the solder layer 18, and the solder layer 18 and the metal layer 22 are surely brought into contact with each other.

Then, as described in this embodiment, at least a part of the metal stud 22*a* is penetrated into the inside of the solder layer 18, whereby the contact length of the solder layer 18 and the metal layer 22 is longer as compared to the case where the solder layer 18 and the metal layer 22 are simply brought into contact. Thus, a metal-bonding force is enhanced.

The circuit board 10 of this embodiment is a flexible printed board. In the invention in which the conductor post 16 and the electrode pad 24 are firmly bonded, the thermal stress caused at the bonding section can be reduced by the use of the flexible printed board serving as the circuit board 10. That is, when bonding of the conductor post 16 and the electrode pad 24 is simply strengthened, the solder layer 18 and the metal layer 22 are subjected to high thermal stress due to the difference in linear expansion coefficients of the base member 12 and the chip substrate 21. For this reason, the yield and durability of the electronic component package 100 are reduced by thermal shock when it is cooled from the reflow temperature to a normal temperature and heat cycle during operation or suspension of the electronic component package 100. On the other hand, the above problem of the reduced thermal stress due to bending of the base member 12 is solved by providing stretchability in the in-plane direction to the base member 12 of the circuit board 10.

In other words, in the present invention in which the solder layer 18 and the metal layer 22 are firmly bonded to each other using the adhesive layer 30 containing a flux activating compound, contact adhesion of the conductor post 16 and the electrode pad 24, and heat strength of the electronic component package 100 are balanced and thus increased by synergistic effect with the use of the flexible printed board as the circuit board 10 as in this embodiment.

Furthermore, in the recent electronic component 20, with the trend of higher density and higher functionality of packages, the number of electrode pads 24 increases from several hundreds to several thousands, or more than that number due to so-called use of more pins. For this reason, to mount the electronic component 20 on the circuit board 10, wiring of the circuit board 10 is complicated, and at the same time the individual solder layer 18 to bond the conductor post 16 and the metal layer 22 is extremely reduced in size.

Accordingly, as shown in FIG. 3, complicated wirings are achieved by using a multilayer substrate for the circuit board 10, and at the same time the metal layer 22 and the solder layer 18 are metal-bonded in a good and certain manner using the adhesive layer 30 containing a flux activating compound as in this embodiment, whereby it is possible to cope with use of more pins in recent years.

Furthermore, in this method, in the step of aligning the position, the circuit board 10 and the electronic component 20 are brought into pressure contact in a heated state while the conductor post 16 and the electrode pad 24 are opposed to each other, so that the circuit board 10 and the electronic component 20 are bonded by means of the adhesive layer 30. Then, in the bonding step, the solder layer 18 is heat-melted so that the solder layer 18 and the metal layer 22 are metal-bonded. Also, the adhesive layer 30 of this embodiment is thermosetting. Accordingly, in a series of heating steps of the step of aligning the position and the bonding step, both actions of growing of the intercalation compound region caused at the interface between the solder layer 18 and the metal layer 22, and heat curing of the adhesive layer 30 are achieved.

Second Embodiment

Further, the present invention is not restricted to the aforementioned embodiments, and various modifications, improvements and the like are intended to be included within the scope of the present invention in the ranges in which the object of the present invention can be achieved.

Figure 8:
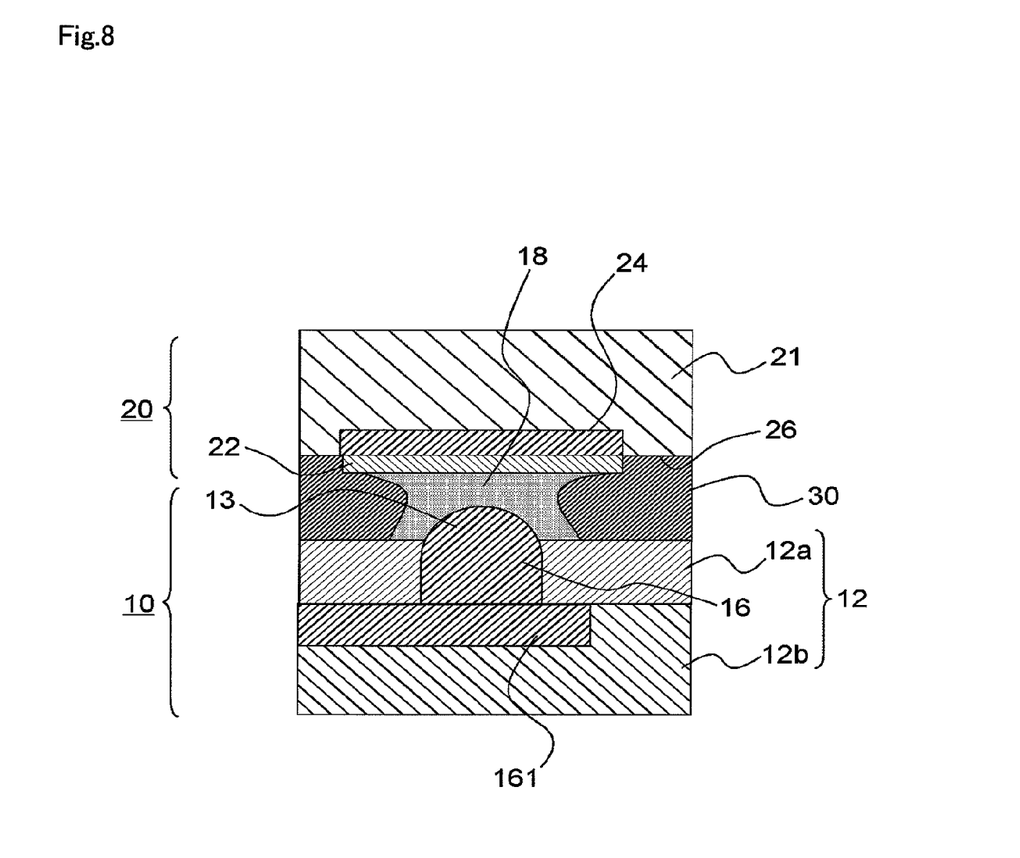
FIG. 8 is an enlarged cross-sectional view in the vicinity of a conductor post of the electronic component package according to a second embodiment.

FIG. 8 is an enlarged cross-sectional view in the vicinity of the conductor post 16 of the electronic component package 100 according to this embodiment. FIG. 8 corresponds to FIG. 2 of the first embodiment.

This embodiment is different from the first embodiment in that the metal layer 22 mounted on the electrode pad 24 is formed in a film form.

More specifically, as the metal layer 22 of this embodiment, there may be used a solder plating layer containing at least one kind of a nickel-gold plating layer, an aluminum plating layer, a gold plating layer, a nickel plating layer and a copper plating layer, or tin. The nickel-gold plating layer mentioned herein is a layer with a top layer of gold or a gold alloy formed on an under layer of nickel or a nickel alloy located close to the electrode pad 24.

When a copper plating layer is used as the metal layer 22, its surface may be coated with preflux.

The metal layer 22 of this embodiment is formed on the surface of the electrode pad 24 in a layered form. The solder layer 18 which is provided at the front end 13 of the conductor post 16 is pressed against the metal layer 22 in a heated state, whereby the solder layer 18 is rendered in a semi-melted state to be located close to the surface of the metal layer 22 to cause metal-bonding. Then, the re-solidified solder layer 18 bonds the metal layer 22 and the surface base member 12*a*.

That is, the metal layer 22 may be formed in a flat, layered form as in this embodiment, in addition to the rivet-like metal stud 22*a* as in the first embodiment, and its shape is not particularly limited.

The present application claims priority to Japanese Patent Application No. 2008-300113 filed on Nov. 25, 2008. The contents of the application are incorporated herein by reference in their entirety.

The invention claimed is:

1. An electronic component package comprising:
    a circuit board having a base member, an electrically-conductive conductor post which is buried in said base member, and a solder layer which is provided at the front end of said conductor post while exposed from a surface of said base member,
    an electronic component in which an electrode pad having a metal layer mounted thereon is provided on the main surface thereof, and
    an adhesive layer containing a flux activating compound, and bonding said surface of said base member and said main surface of said electronic component,
    wherein said metal layer and said solder layer are metal-bonded,
    said conductor post is on an electrode section, wherein the electrode section is in the inside of the circuit board, and
    said solder layer is formed on the conductor post and on the surface of the base member so as to entirely cover the conductor post.

2. The electronic component package according to claim 1, wherein said solder layer contains tin, and
    said metal layer is made of at least one kind of metals selected from gold, nickel, aluminum and copper, an alloy containing said metal, or a solder containing tin.

3. The electronic component package according to claim 2, wherein said metal layer is formed in a film form.

4. The electronic component package according to claim 2, wherein said metal layer comprises gold.

5. The electronic component package according to claim 4, wherein a compound comprised of gold and tin is formed into a layer at the interface of said solder layer and metal layer.

6. The electronic component package according to claim 1, wherein said metal layer is a metal stud protruding towards said circuit board.

7. The electronic component package according to claim 6, wherein at least a part of said metal stud is penetrated into the inside of said solder layer.

8. The electronic component package according claim 1, wherein said circuit board is a flexible printed board.

9. The electronic component package according to claim 1, wherein said circuit board is a multilayer substrate obtained by laminating a plurality of wiring layers to one another which are electrically connected with said conductor post.

10. The electronic component package according claim 1, wherein said electronic component is a semiconductor element, and said circuit board is an interposer substrate.

11. The electronic component package according to claim 1, wherein said metal layer has a protruding section that protrudes in the direction perpendicular to the plane of said electrode pad.

12. The electronic component package according to claim 1, wherein the front end of said conductor post has a convex surface.

13. The electronic component package according to claim 1, wherein the front end of said conductor post protrudes upward from the surface of said base member.

14. The electronic component package according to claim 1, wherein the metal layer is separated from the conductor post.

* * * * *